(12) United States Patent
Olszewski et al.

(10) Patent No.: US 7,189,446 B2
(45) Date of Patent: Mar. 13, 2007

(54) CURVED HONEYCOMB ARTICLE, EUV APPARATUS HAVING A CURVED HONEYCOMB ARTICLE, AND METHOD OF MAKING A CURVED HONEYCOMB ARTICLE

(75) Inventors: Anthony R. Olszewski, Bath, NY (US); Paul M. Then, Victor, NY (US); John F. Wight, Jr., Corning, NY (US)

(73) Assignee: Corning Incorporated, Corning, NY (US)

( * ) Notice: Subject to any disclaimer, the term of this patent is extended or adjusted under 35 U.S.C. 154(b) by 191 days.

(21) Appl. No.: 10/882,011

(22) Filed: Jun. 30, 2004

(65) Prior Publication Data

US 2005/0008818 A1    Jan. 13, 2005

Related U.S. Application Data

(60) Provisional application No. 60/486,591, filed on Jul. 11, 2003.

(51) Int. Cl.
*B32B 3/12* (2006.01)
*H05G 2/00* (2006.01)
*G21K 5/00* (2006.01)

(52) U.S. Cl. ............... 428/116; 428/73; 250/493.1; 378/34

(58) Field of Classification Search ............... 428/116, 428/73; 250/504 R, 493.1; 378/119, 34
See application file for complete search history.

(56) References Cited

U.S. PATENT DOCUMENTS

| 3,196,533 | A | 7/1965 | Ida et al. |
| 3,578,526 | A | 5/1971 | Harding |
| 3,658,974 | A | 4/1972 | Scholl |
| 4,242,588 | A | 12/1980 | Silk et al. |
| 4,837,794 | A | 6/1989 | Riordan et al. |
| 5,103,641 | A | 4/1992 | Maus et al. |
| 6,109,767 | A | 8/2000 | Rodriguez |
| 6,299,958 | B1 | 10/2001 | St. Julien et al. |
| 6,468,374 | B1 | 10/2002 | Kar et al. |
| 6,479,129 | B1 | 11/2002 | Kar et al. |

FOREIGN PATENT DOCUMENTS

WO    WO99/42904    8/1999

OTHER PUBLICATIONS

Newport Glass, "Fused Cellular Mirror", available on the internet at http//www.newportglass.com/afuscelr.htm, downloaded Mar. 31, 2003.

*Primary Examiner*—Jennifer McNeil
*Assistant Examiner*—G. Blackwell
(74) *Attorney, Agent, or Firm*—Walter M Douglas; Timothy J. Schoeberle; James V. Suggs

(57) ABSTRACT

The present invention provides a curved honeycomb article having a first face, a second face, and a plurality of channels formed from the first face to the second face, each channel having a channel axis, the curved honeycomb article having a width of at least about 15 cm in at least one direction in the plane normal to a channel axis at its geometrical center, each channel having a virtual channel extension associated therewith, the virtual channel extensions defining a convergence area substantially smaller than the occluded area of the curved honeycomb article. Methods for making the curved honeycomb article and apparati using the curved honeycomb article are also disclosed.

11 Claims, 5 Drawing Sheets

CURVED HONEYCOMB ARTICLE, EUV APPARATUS HAVING A CURVED HONEYCOMB ARTICLE, AND METHOD OF MAKING A CURVED HONEYCOMB ARTICLE

CROSS REFERENCE TO RELATED APPLICATIONS

This application claims the benefit of U.S. Provisional Application Ser. No. 60/486,591, filed Jul. 11, 2003, entitled "Curved Honeycomb article, EUV Apparatus Including a Curved Honeycomb Article, and Method of Making a Curved Honeycomb Article," which is hereby incorporated herein by reference in its entirety.

BACKGROUND OF THE INVENTION

1. Field of the Invention

The present invention relates generally to the manufacture and use of novel honeycomb articles.

2. Technical Background

The desire for faster, more powerful integrated circuits has led to rapid development of advanced ultraviolet photolithographic methods. The performance of an integrated circuit increases as the feature size decreases; hence, a decrease in feature size allows more circuitry to be put on a chip of a given size, and reduces the power needed for operation. The feature sizes obtainable in a photolithographic process depend on the wavelength of radiation used in the exposure step; shorter wavelengths enable smaller feature sizes. As such, there has been a trend toward shorter wavelengths in photolithographic processes. Currently, photolithography systems based on wavelengths as low as 193 nm and 157 nm are being developed for commercial use.

In order to further decrease the minimum feature size obtainable in photolithographic processes, it has been suggested to use extreme ultraviolet (EUV) radiation, for example, having a wavelength of about 13 nm. The use of EW radiation in photolithography, while greatly reducing feature size, forces a radical departure in design from currently used photolithographic apparati. First, no practical materials are sufficiently transparent to EUV radiation to be used as windows, lenses or photomasks. As such, any manipulation of the radiation must be performed using reflection. Mirrors constructed from alternating layers of molybdenum and silicon have been used as reflecting focusing mirrors, collimators, and photomasks in EUV apparati.

Further, EUV sources tend to be rather dirty. In one conventional EUV source, a high energy laser is used to heat an object, which functions as a source of secondary emission of mainly shortwave radiation. This process releases undesirable particles and atoms, forming debris in the apparatus. The debris, known generally herein as "soot," can deposit on the mirrors and on the photomask, wreaking havoc with the necessarily precise optical system of the EUV apparatus. Since there currently exists no suitable window material for EUV radiation, the design of a device to catch the particulate matter while transmitting the EUV radiation is not trivial. One suggestion for an EUV soot filter is described in international patent application publication WO 99/42904, which is incorporated herein by reference. The apparatus described therein is placed between the EUV source and optical system, and has a plurality of foils or plates arranged in a direction radial from the EUV source. The position of the plates allows any EUV radiation propagating directionally from the EUV source to the optical system to be transmitted, but will catch the randomly diffusing soot. The filter is assembled from a plurality of copper plates; such a filter would be difficult to assemble, especially as the desired size of the filter increases. It would be desirable to have an EUV soot filter that is simple to fabricate and easily adaptable to a number of EUV source geometries.

SUMMARY OF THE INVENTION

One embodiment of the present invention relates to a method for making a curved, honeycomb article, the method including the steps of providing a honeycomb body having a first face, a second face, and a honeycomb structure having a plurality of substantially parallel channels formed from the first face to the second face; filling the channels of the honeycomb body with a filler material, thereby forming a filled honeycomb composite; molding the filled honeycomb composite to form a curved filled honeycomb composite; and finishing the curved filled honeycomb composite into the curved honeycomb article, wherein during the step of molding, the filler material has a plastic deformation behavior compatible with that of the honeycomb body.

Another embodiment of the present invention relates to an EUV lithography apparatus including an EUV source; an optical system coupled to the EUV source; and a curved honeycomb article made using the process described above placed operatively between the EUV source and the optical system, such that a substantial fraction of the EUV radiation generated by the EUV source propagates through the channels of the curved honeycomb article.

Another embodiment of the present invention relates to a curved honeycomb article having a first face, a second face, and a plurality of channels formed from the first face to the second face, each channel having a channel axis, the curved honeycomb article having a width of at least about 15 cm in at least one direction in the plane normal to a channel axis at its geometrical center, each channel having a virtual channel extension associated therewith, the virtual channel extensions defining a convergence area substantially smaller than the occluded area of the curved honeycomb article.

Another embodiment of the invention relates to an EUV lithography apparatus including an EUV source; an optical system coupled to the EUV source; and the curved honeycomb article described above placed operatively between the EUV source and the optical system, such that a substantial fraction of the EUV radiation generated by the EUV source propagates through the channels of the curved honeycomb article.

The curved honeycomb articles, EUV apparati, and methods of making curved honeycomb articles of the present invention result in a number of advantages over prior art devices and methods. The curved honeycomb articles of the present invention may be made to be quite large, and may be curved in many desirable geometries (e.g., spherical, elliptical, cylindrical, or more complex). The EUV apparati using the curved honeycomb articles of the present invention may utilize relatively large EUV sources. Further, use of the curved honeycomb articles of the present invention in an EUV apparatus can provide a high degree of debris mitigation in EUV photolithographic processes. The methods of the present invention can be used to easily and relatively rapidly form curved honeycomb elements with a minimum of waste. The methods can be adapted by the skilled artisan to make a wide variety of curved honeycomb geometries.

Additional features and advantages of the invention will be set forth in the detailed description which follows, and in part will be readily apparent to those skilled in the art from the description or recognized by practicing the invention as described in the written description and claims hereof, as well as in the appended drawings.

It is to be understood that both the foregoing general description and the following detailed description are merely exemplary of the invention, and are intended to provide an overview or framework for understanding the nature and character of the invention as it is claimed.

The accompanying drawings are included to provide a further understanding of the invention, and are incorporated in and constitute a part of this specification. The drawings are not necessarily to scale, and sizes of various elements may be distorted for clarity. The drawings illustrate one or more embodiment(s) of the invention, and together with the description serve to explain the principles and operation of the invention.

DETAILED DESCRIPTION OF THE PREFERRED EMBODIMENTS

Figure 1:
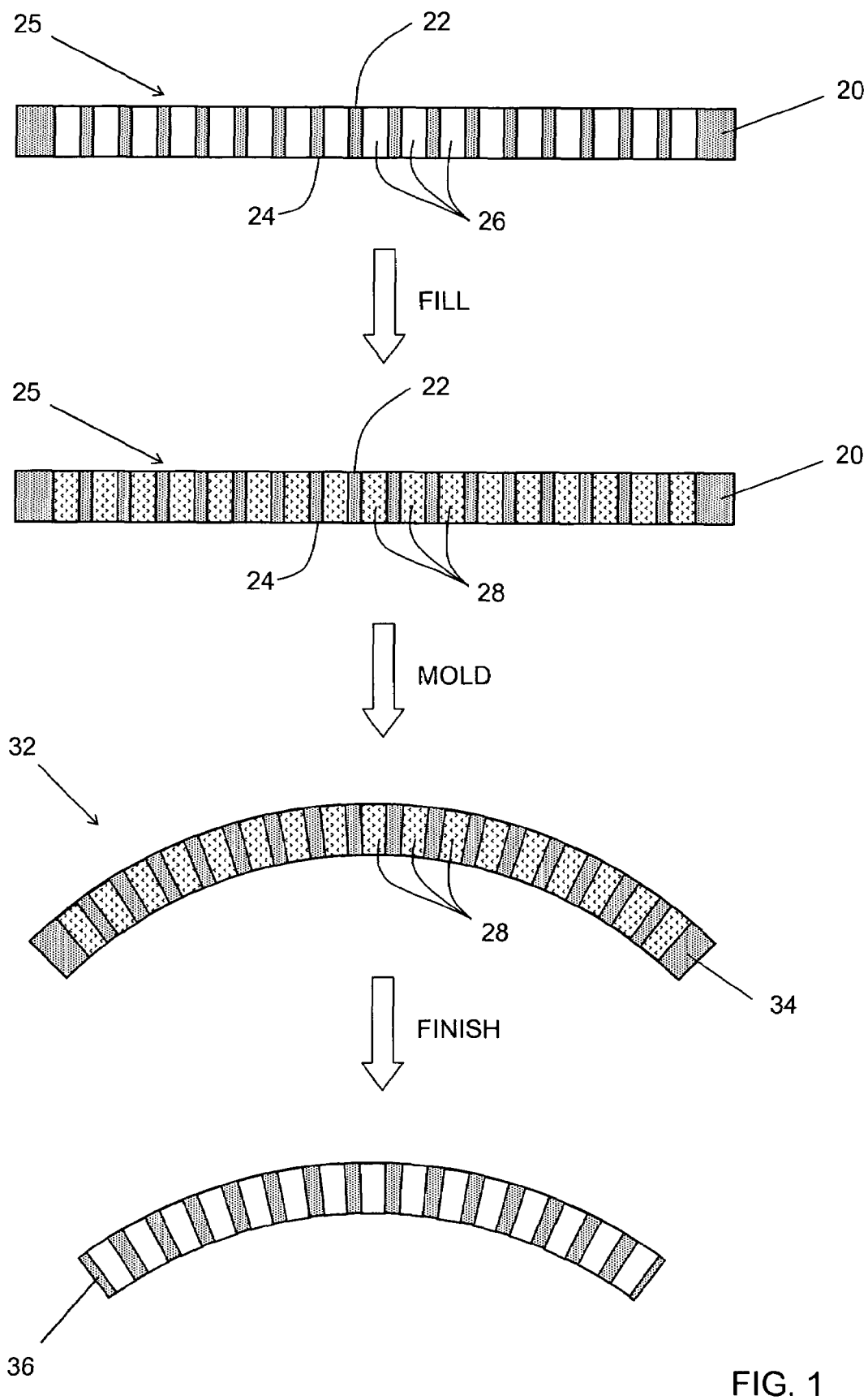
FIG. 1 is a schematic view of a method of making a curved honeycomb article according to one embodiment of the present invention.

One embodiment of the present invention relates to a method of making a curved honeycomb article that is especially useful as a soot filter in EUV methods and apparati. The method according to one embodiment of the invention is shown in schematic cut-away view in FIG. 1. A honeycomb body 20 having a first face 22, a second face 24, and a honeycomb structure 25 formed from a plurality of substantially parallel channels 26 formed from the first face to the second face is provided. Channels 26 of honeycomb body 20 is then filled with a filler material 28 to form a filled honeycomb composite 30. Filled honeycomb composite 30 is molded (e.g. forged) to form a curved filled honeycomb composite 32, which comprises a curved honeycomb body 34 filled with filler material 28. Curved filled honeycomb composite 32 is finished to form the curved honeycomb article 36. As will be described in more detail below, the curved honeycomb bodies and articles made by the method of the present invention may have a variety of shapes, such as a spherical shell segment shape, or a cylindrical shell segment shape.

The honeycomb body 20 may be made from a variety of materials and by a variety of methods. Ceramic honeycomb structures are widely used for applications such as catalyst substrates and honeycomb heaters. The fabrication of honeycomb structures by extrusion of plasticized batches of inorganic powders is well known, and is described in U.S. Pat. Nos. 3,790,654 and 3,905,743, each of which is incorporated by reference in its entirety. These extrusion methods typically involve compounding a batch material having a plastic consistency from inorganic powders, plasticizer, vehicle and binder components. The plasticized batch is thereafter forced through an extrusion die to form a honeycomb shape, which may be solidified by drying and firing.

Dies for honeycomb extrusion typically have a die body incorporating a number of feedholes on an inlet face which extend through the body to convey the plasticized batch material to a discharge section on an opposing die outlet face. The discharge section incorporates a criss-crossing array of discharge slots, cut into the outlet face to connect with the feedholes within the die body. These slots reform the batch material supplied by the feedholes into the interconnecting cell wall structure of the desired honeycomb body.

The composition of the inorganic powders used to formulate the plasticized batch for extrusion of the honeycomb body is not critical. The powders may be, for example, metallic, semi-metallic, ceramic, glass, polymeric, or mixtures thereof. The powders may be employed either in raw (mineral) or refined form. Specific examples of powder types include powdered glasses or powdered crystalline or semi-crystalline ceramic materials, or the precursors thereof, particularly including amorphous silicate, borate or aluminate glasses and/or crystalline oxides (e.g. silicates, aluminates, borates), carbides, borides, and aluminides. High purity glass soot formed, for example, by a flame hydrolysis process may also be used, as described in U.S. Pat. No. 6,468,374, which is incorporated herein by reference in its entirety. Particular powder materials may include mineral powders such as cordierite, spinel, various clays, talc, refined powders of alumina, silica, and the oxides of calcium, magnesium, boron, titanium, germanium, and the alkali and transition metals, and various mixtures or chemical combinations thereof. Powdered polymers (e.g., PTFE), and powdered metals (e.g., tungsten) may also be used.

The plasticizing vehicle/binder system used to compound the plasticized powder batch will depend in part on the composition and morphology of the solid powder components of the batch. Aqueous binder systems comprising a water vehicle and a plasticizing additive such as a cellulosic binder, e.g., a methyl hydroxypropyl cellulose, can provide highly plastic batches, particularly if the powders include substantial proportions of kaolinitic clays. Batches of this type, disclosed for example in U.S. Pat. No. 3,885,997, which is incorporated herein by reference, are presently in large-scale commercial use for the production of cordierite honeycombs.

Other components which may be present in these types of binder systems, both for metallic and for ceramic powders, include dispersants, surfactants, lubricants, polymers and/or additional water-miscible and/or water-immiscible organic vehicles. Specific types of compounds which may been included in these batches include the alkali stearates, oleic acid and its derivatives, and co-binders such as the polyvinyl alcohols and silicones.

Non-aqueous binder systems that secure a degree of plasticity to an extruded honeycomb shape can also be used. These may include polymer, solvent, or wax-based binder systems, the latter including mixtures of waxes, wax-polymer blends, and solutions of waxes in various organic solvents. U.S. Pat. No. 5,602,197, for example, discloses extrudable ceramic and/or metal powder batches with particularly good post-forming plasticity, based on a gelling binder system comprising an elastomeric polymer component (e.g. a KRATON brand elastomeric polymer) dissolved in a low-melting wax vehicle.

Batches formed from the selected inorganic powders and aqueous or non-aqueous binder systems may be compounded and conditioned for extrusion using known mixing and plasticizing methods and equipment, and may be formed into honeycomb bodies by conventional forming procedures such as molding or, more preferably, extrusion. Continuous extrusion procedures and apparatus, such as disclosed, for example, in U.S. Pat. Nos. 3,790,654 and 4,551,295, are particularly well suited to the production of precisely engineered honeycomb bodies at relatively low cost.

Figure 2:
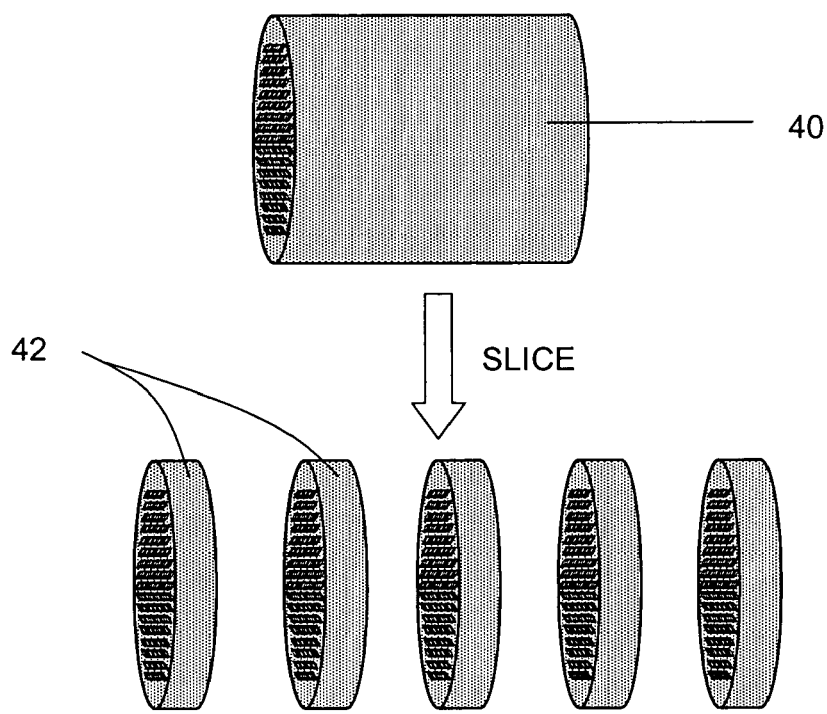
FIG. 2 is a schematic view of a method of providing a honeycomb body.

The extrusion process can conveniently be used to make long honeycomb structures which may not be desirable (or necessary) for the molding process used in the present invention. As shown in FIG. 2, it may be desirable to use an extrusion process to make an elongated honeycomb structure 40, then slice the elongated honeycomb structure into thinner honeycomb bodies 42 more suitable for the molding processes described herein.

The extruded honeycomb body may be used in its as-extruded plastic state (i.e. "wet-green"), or may be hardened to a "dry-green" state before the step of filling. Hardening may be accomplished, for example, by drying, gelling, or freezing. The hardening is desirably conducted in a reversible manner such that the honeycomb body can be returned to its plastic state before the molding step.

The skilled artisan will recognize that other methods may be used to make the honeycomb bodies used in the present invention. For example, stack-and-draw methods and coextrusion methods as well as conventional machining and molding methods may be used to make the honeycomb bodies used in the present invention.

Figure 3:
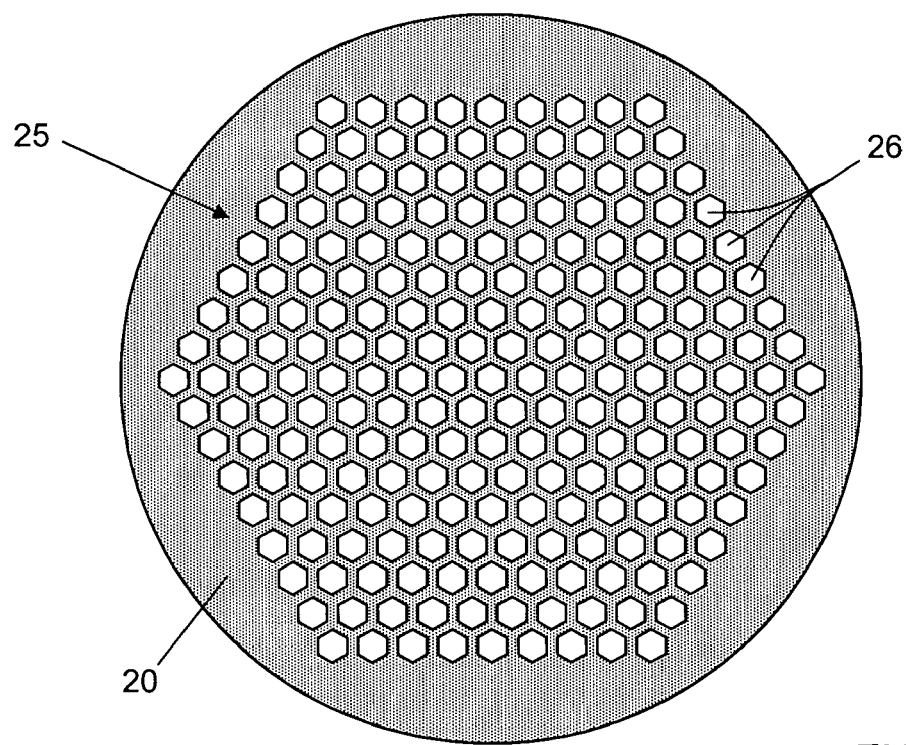
FIG. 3 is a top view of the honeycomb body used in the method of FIG. 1.

As shown in FIG. 3, the honeycomb body 20 has a honeycomb structure 25. The honeycomb structure may have any desired geometry (e.g. square, triangular, hexagonal); however, the hexagonal cell geometry shown in FIG. 3 is especially desirable, as it is highly compliant and isotropic in the plane.

Filling of the parallel channels of the honeycomb body with an appropriate filler material should be accomplished in a manner which will protect the cellular channel structure of the honeycomb body from inadvertent damage to or alteration of the initial channel size, shape and volume during the filling process. In the case of honeycomb bodies which are to be filled in their as-extruded plastic state, the filler material will typically be introduced into the honeycomb channel structure in liquid or dispersed form. The liquid filler material is then partly or completely solidified to convert it to a plastic state suitable for molding of the filled honeycomb composite. Solidification may result, e.g., from crystallization or gelling. In the case of gelling, the gelling process may be initiated by a change in temperature, or by the addition of a gelling agent, combined with the filler material before filling, or introduced therein from the channel walls of the honeycomb body. When the as-extruded honeycomb body is hardened before the filling step (e.g., by freezing or drying), conversion of the filler material to liquid form is not necessary. In such a case, filler materials having a semi-solid or paste consistency at filling temperatures can be introduced into the channels. Excess filler material should be trimmed away from the filled honeycomb composite.

The filler material is selected such that it has a plastic deformation behavior compatible with that of the honeycomb body during the molding step. By compatible deformation characteristics is meant that the honeycomb body and the filler material deform as if they were one at the temperature of the molding step. If the filler material is marginally soft, reshaping of the honeycomb structure during molding may occur in a fracture manner rather than in the desired plastic manner. When reshaping is accompanied by fracturing sufficient to introduce voids or openings in the honeycomb channel walls, the honeycomb body and filler materials do not have compatible deformation characteristics.

One suitable test for evaluating the physical suitability of a candidate filler material is the blunt indenter test. In this test, the end of a 2 mm diameter rod is pushed perpendicularly into a candidate filler material at a pre-determined molding temperature (i.e., the temperature to be used in the subsequent molding step) and the filler deformation mechanism is noted. An elastic response (e.g. a JELLO gelatin-like recovery) is undesirable. A brittle response (e.g. radiating fracture lines and haze) is also undesirable. A plastic response (e.g. a plastic heaving up of the material about the indenter) is desirable.

The chemical composition of the filler material will be selected with due regard for the composition of the honeycomb body, most importantly the composition of the honeycomb binder system employed. The filler material should have little or no solubility in or miscibility with the binder components of the honeycomb body, nor should it exhibit substantial osmotic affinity or solvating activity for any components of the binder system. In general, these conditions will be favored if hydrophobic filler materials (e.g. wax-based) are used with aqueous binder systems (e.g. methylcellulose-based binders); or if hydrophilic filler materials (e.g. starch or polyethylene glycol based materials) are used with water-immiscible organic binders (e.g. elastomer-based binders). If the filler material and binder share the same solvent, they should be chosen to be in osmotic balance. Optimum filler material compositions for any particular binder system can of course be readily determined through routine experiment, using a suitable binder/filler material contact interval to identify interactions deleterious to the requisite properties of either.

Examples of families of filler materials useful in combination with aqueous binder systems include heat softenable vegetable or animal fats, natural or synthesized fatty acids, polyalcohols and/or esters, paraffins (often blended with other components for improved flexibility and plasticity), other hydrocarbon waxes, both natural and synthetic, and synthesized thermoplastic polymeric materials. Particular examples of filler materials of these types range from butter to microcrystalline wax to crystalline waxes in combination with modifiers such as propylene glycol monostearate and mineral oil. Butyl rubber and/or poly(isobutylene) may be used as filler additives to modify the properties of the filler materials, particularly the microcrystalline waxes. Specific filler materials of wax type which are expected to offer good performance when used with aqueous honeycomb binder systems containing methylcellulose and/or hydroxypropyl methylcellulose as the principal plasticizing constituent are reported below in Table 1. Included in the Table for selected ones of the filler materials are the melting points of the materials (as determined by ASTM D-127), needle penetration at 25° C. (ASTM D-1321) viscosity at 99° C. (in Saybolt Universal Seconds (SUS) per ASTM D-445) and density at ambient (25° C.) and near-boiling (99° C.) temperatures. As typical of many commercial wax formulations, certain of the physical and thermal properties of the waxes are reported as ranges. These values are not controlled to discrete values by wax manufacturers, since the properties of the products may vary within relatively wide limits without adversely impacting utility for most commercial applications. In general the materials reported in Table 1, which may all be characterized as microcrystalline waxes, are ranked in general order from relatively hard and flexible to relatively soft and sticky in character.

TABLE 1

| Filler Material | Melting Point (° C.) | Needle penetration at 25° C. | Viscosity at 99° C. (SUS) | Density at 25° C./99° C. (g/mL) |
|---|---|---|---|---|
| Bareco Victory Wax | 74/79 | 20/35 | 70/90 | 0.93/0.79 |
| Bareco Ultraflex Wax | 63.9/74.4 | 21/39 | 79/94 | 0.92/0.79 |
| Witco W-445 wax | 77/82 | 25/35 | 75/90 | |
| Witco W-835 wax | 74/79 | 60/80 | 75/90 | |
| Blended wax BW-568 | 74 | 65 | | |

As previously indicated, the relative plasticities of the various filler material and honeycomb powder/binder mixtures used in the practice of the invention are typically temperature dependent. That is, each of the components of the filled honeycomb composite will have plastic characteristics which depend at least to some degree on the temperature of its constituent materials. This does not present a problem provided there is a least some temperature range over which the deformation characteristics of the filler material are sufficiently compatible with those of the honeycomb body so that the filler material will plastically and hydrostatically support the cellular honeycomb structure from buckling and/or fracturing during the process of molding. Further information regarding reshaping of filled honeycombs can be found in U.S. Pat. No. 6,299,958, which is incorporated herein by reference in its entirety.

The filled honeycomb composite formed by filling the honeycomb body with the filling material desirably has a thickness (i.e. in the direction parallel to the channels) that is small enough to allow for rapid heat transfer through the entire thickness during the molding step. Using a filled honeycomb composite with a relatively small thickness in the present invention allows the skilled artisan to fabricate large curved honeycomb bodies (e.g. greater than 16 cm in diameter) without complications due to poor heat transfer to the interior of the filled composite. The filled honeycomb composite is desirably less than about 8 cm in thickness. More desirably, the filled composite is less than about 4 cm in thickness. In certain desirable embodiments of the invention, the filled honeycomb composite has a thickness between about 12 mm and about 3 mm.

If the honeycomb body was hardened to a dry-green state before filling, it may be necessary to first reconstitute the dry-green body to a plastic wet-green body before filling. It is possible to return a dry-green honeycomb body earlier hardened by drying (but not sintering) to a plastic condition by introducing a liquid back into the structure. Where the dry-green body is originally plasticized with a water solution of a reversibly thermogellable binder such as a cellulose ether and thereafter dried, reconstitution may be accomplished by saturating the pores of the body with water at a temperature above the gel point of the binder. Any liquid water remaining in the channels should be removed (e.g., by draining) prior to reducing the temperature of the body to the gel point. For example, in the case of a honeycomb body formed from mineral powders bound together with a methyl cellulose binder additive, exposure to near-boiling water can develop the saturation necessary to provide plasticity without undesirable swelling of the binder.

In one example of a suitable method form making the filled honeycomb composite, a hot wet-green honeycomb body is filled with hot wax, then cooled to solidify the wax in the channels and to redissolve the plasticizer into the channels.

The filled honeycomb composite is then molded into a curved filled honeycomb composite using a method selected for its compatibility with the material of the honeycomb body and the filler material. The molding method may be a confined method (as in an isostatic pressing method), or an unconfined method (as in a sagging method). In a confined method, the volume of the material being molded is inhibited from increasing (by cracking), for example by application of a pressure to the entire filled honeycomb while molding. In an unconfined method, the volume of the material being molded may increase in the molding process; this can occur globally by an increase in porosity, or locally and coarsely when the material fractures on bending or stretching.

When easy fracture on bending occurs, the honeycomb body is referred to as being "short". A "short" honeycomb body coarsely and locally fractures rather than finely and uniformly fractures (unsaturates to become porous) or plastically (constant volume) deforms under unconfined deformation. An extrudable "short" material may be plastic under confined deformation, but may be brittle under unconfined deformation. Particularly for relatively "short" materials such as methyl cellulose-plasticized clay-based batches of the kind used for commercial cordierite honeycomb production, the preferred mode of molding is compressive (e.g. press molding) rather than tensile (e.g. sagging). As noted above, compressive or confined deformation methods tend to keep the volume of the material constant during deformation so as to not introduce a compressible phase (i.e. an open crack, pore or void).

In cases where the material of the honeycomb body is quite "short" and/or the filler material is too soft, the filler material penetrates and/or opens fissures in the honeycomb channel walls. This permits the honeycomb body volume to increase, i.e., an decrease in open frontal area of the honeycomb body due to the increase in volume of the honeycomb wall structure and the decrease in volume of the channels. Particularly for many ceramic-powder-filled pastes, the honeycomb body is only plastic under constant volume (confined) deformation, and even in that case an overly-soft fill promotes fissuring and checking. This is most clearly observed with some of the softer waxes. With extreme softness the filler material tends to be expelled from the honeycomb channels during molding, causing complete or partial collapse of some or all of the channels. Conversely, if the filler material is too hard and brittle, then gross fractures/slips can form, as indicated by cell mis-registration throughout the curved honeycomb body. This can be observed with some of the harder fillers such as propylene glycol monostearate. Again, the optimum molding temperature and conditions for any filler material/honeycomb body system can readily be determined by routine experiment.

Figure 4:
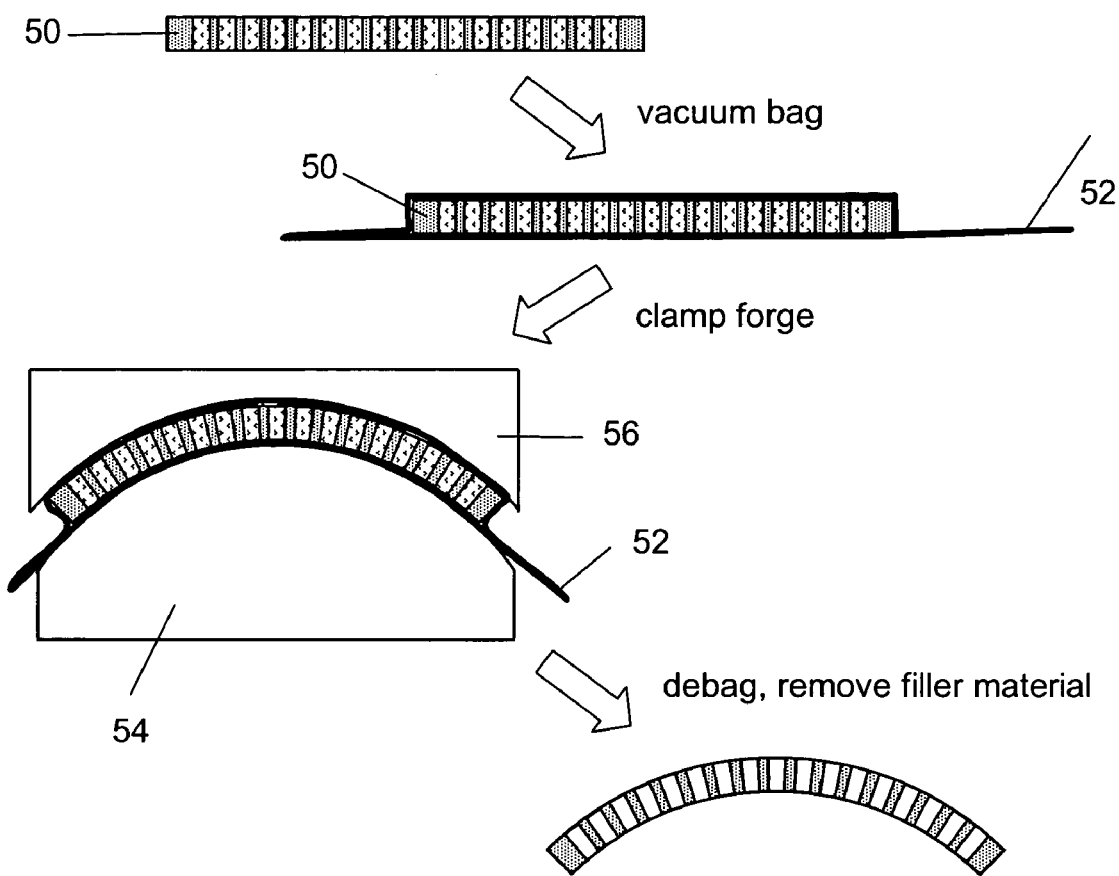
FIG. 4 is a schematic view of a method of molding a filled honeycomb composite to form a curved filled honeycomb composite.

An example of a desirable molding process for use with a filled composite based on a wax-filled cordierite honeycomb body (e.g., as described in U.S. Pat. Nos. 3,885,997 and 6,299,958) is shown in schematic view in FIG. 4. The filled honeycomb composite 50 is first vacuum bagged. The step of vacuum bagging may be desirable in order to help prevent cracks from opening during the molding step. Vacuum bagging helps keep the filled honeycomb composite in a compressed state during the molding step, thereby helping to ensure a confined molding environment. The filled honeycomb composite 50 (inside vacuum bag 52) is then clamp forged between convex tool 54 and concave tool 56 to form a bagged, curved filled honeycomb composite having a concave fact and a convex face. If the desired curvature has a small radius of curvature, it may be necessary to perform the clamp forging in a plurality of steps, using multiple tools of decreasing radius of curvature, thereby forming a progressively greater curvature in each step. When forging in a plurality of steps, it may be desirable to anneal the curved filled honeycomb composite (as described below) between forging steps. For certain materials, such as the cordierite material mentioned above, the forging step is desirably performed at a somewhat elevated temperature (e.g.30–40° C.). The bagged, curved filled honeycomb composite may then be annealed, desirably in an isostatic press chamber. In an alternative embodiment of the invention, the clamp forging is performed in an isostatic press chamber, with or without vacuum bagging.

As the skilled artisan will recognize, the general molding technique described above may be modified in a number of ways. For example, a rubber bladder may be used as one of the tools (convex or concave); the bladder may be expanded using liquid or gas pressure to force the honeycomb body against a second tool. The honeycomb body may be kept in a compressed state during molding using methods other than vacuum bagging. For example, the honeycomb body may be encased in a wax casement.

After the filled honeycomb composite is molded into the curved filled honeycomb composite, it is finished into a desired curved honeycomb article. As used herein, finishing includes whatever steps are necessary to covert the curved filled honeycomb composite into the curved honeycomb article. For example, if the curved filled honeycomb composite was vacuum bagged, the finishing step may include removing the vacuum bag. During the finishing step, the filler material is desirably removed from the filled honeycomb composite. Filler material removal may be carried out through the use of solvents or other chemical means if desired. However, for most heat-softenable fillers, removal is best affected by the application of a mild heat treatment to melt, liquefy and gravity drain and/or blow and/or blot the filler from the curved filled honeycomb composite to form a curved honeycomb body. It may be desirable to remove any remaining filler material using vacuum pyrolysis.

The curved honeycomb body formed by removing the filler material from the curved filled composite may be treated to harden it to a final, usable state. For plasticized ceramic or metal powder formulations, the treatment typically requires drying (e.g. to remove the water plasticizer) and relatively high temperature firing to debind and to sinter or reaction-sinter the component powders into the desired consolidated material. Residual filler material present in the channel structure in these cases will ordinarily be completely removed by volatilization and/or oxidation in the course of the process. Obviously, more attention will be paid to the presence and/or behavior of residual filler material in the case of very high cell density parts, since capillary effects complicate filler removal as the channels become smaller in diameter. The finishing step may also include trimming the curved honeycomb body (e.g. by grinding, cutting, or machining) into the desired shape of the curved honeycomb article.

Figure 5:
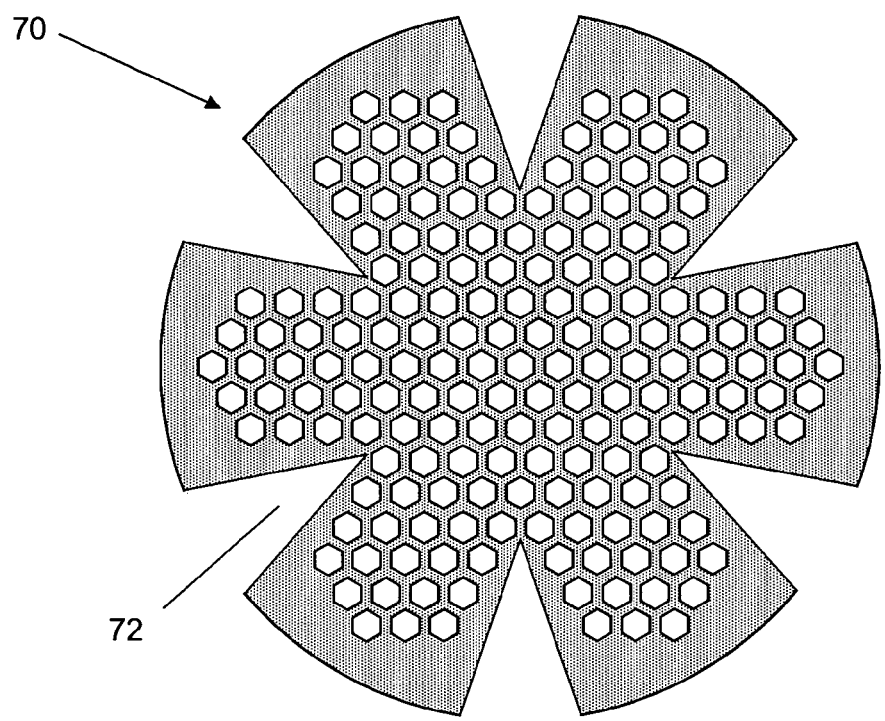
FIG. 5 is a schematic top view of a substantially flat honeycomb body having strain relief features along its perimeter.

In converting a substantially flat honeycomb body to a highly curved (e.g. spherical shell segment shaped) honeycomb body, there are likely to be strains and distortions that will have to be accommodated to avoid fracture. These may become especially important for large bodies and for small radii of curvature, and are expected to be found predominantly around the perimeter of the body. This may be thought of as analogous to the problem of projecting a spherical surface (e.g. the Earth) onto a flat surface (e.g. a map) without distortion. As shown in FIG. 5, it may be desirable for the substantially flat honeycomb body 70 to have a series of strain relief features 72 (e.g. notches around its perimeter. In the molding process, the notches will close, allowing a continuous curved honeycomb body 74 to be formed without undue strain or distortion due to compression of the larger diameter flat honeycomb body along its perimeter to a smaller diameter curved honeycomb body.

Another embodiment of the present invention relates to a curved honeycomb article useful as a soot filter in an EUV lithography device. As shown in cross-sectional view in FIG. 6, curved honeycomb article 100 has a first face 102, a second face 104, and a honeycomb structure 105 formed from a plurality of channels 106 formed from the first face to the second face. Each channel 106 has a channel axis 108. The channel axes should not be mutually parallel. Desirably, most of the channel axes are arranged in a substantially radial fashion in at least one dimension. In certain desirable embodiments of the invention, the channel axes are arranged in a substantially radial fashion in two dimensions. Curved honeycomb article 100 desirably has a width of at least about 15 cm in at least one direction in the plane normal to a channel axis at its geometrical center. More desirably, the curved honeycomb article has a width of at least about 15 cm in two mutually perpendicular directions in the plane normal to a channel axis at its geometrical center. In certain desirable embodiments of the present invention, the curved honeycomb article has a width of at least about 20 cm in at least one direction in the plane normal to a channel axis at its geometrical center. The methods described hereinabove may be used for making the curved honeycomb article according to this embodiment of the invention.

Figure 6:
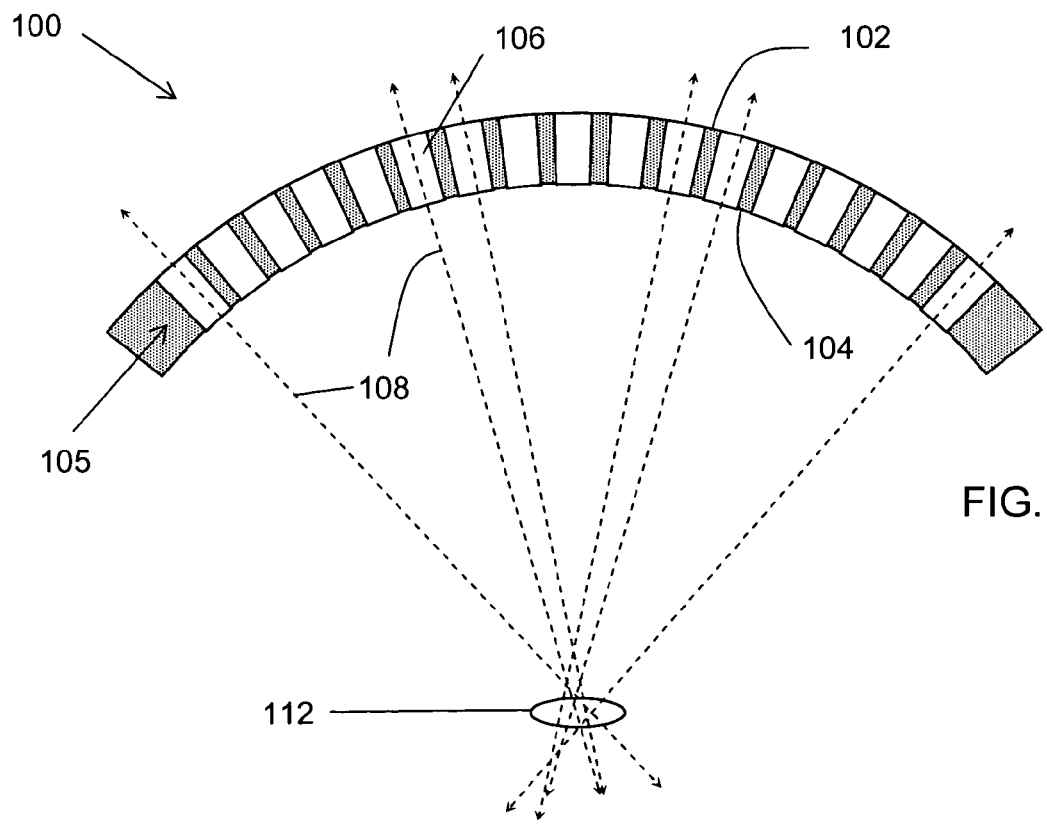
FIG. 6 is a side view of a curved honeycomb article according to one embodiment of the invention.
Figure 7:
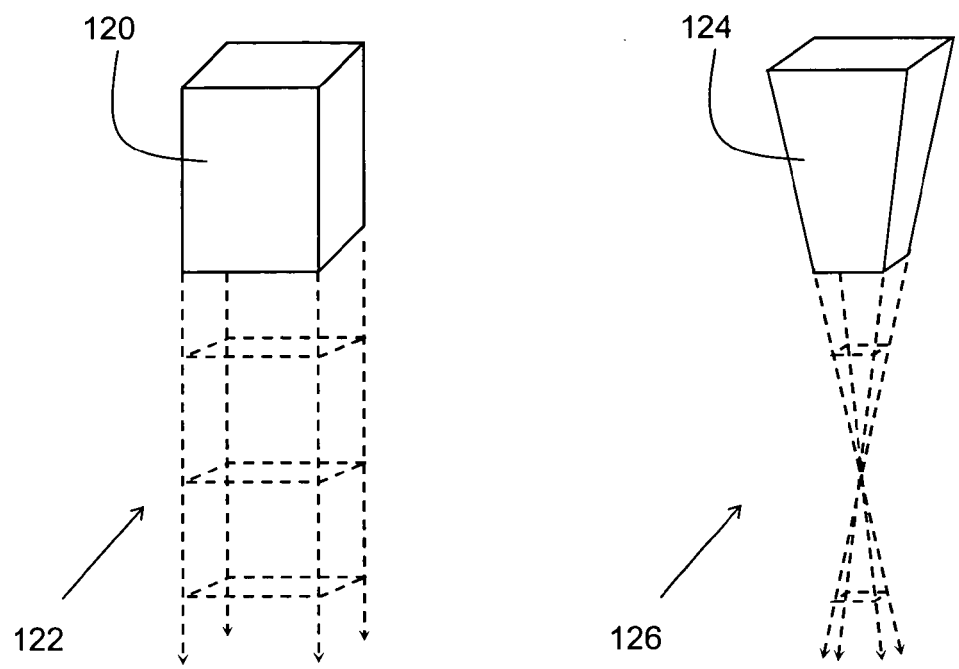
FIG. 7 is a schematic diagram illustrating virtual channel extensions of honeycomb channels.

The honeycomb structure of the curved honeycomb article has an occluded area. For a general curved honeycomb article, the occluded area may be defined as the projection of the honeycomb structure onto a plane perpendicular to a channel axis at its geometrical center. For a curved honeycomb article installed as a soot filter in an EUV apparatus, the occluded area may be defined as the projection of the honeycomb structure onto a plane perpendicular to the optical axis of the EUV apparatus in the neighborhood of the soot filter. Each channel of the honeycomb structure has a virtual channel extension along the concave side of the curved honeycomb article. The virtual channel extension can be thought of as continuing the shape of the channel. As shown in FIG. 7, a channel 120 shaped as a rectangular solid will have a rectangular solid-shaped virtual channel extension 122. A channel 124 having a taper (e.g., the frustum of a square pyramid) will have a virtual channel extension 126 that continues to taper, converges to a point, then becomes larger. The virtual channel extensions of a substantial fraction of the channels of the honeycomb structure define a convergence area. The convergence area is defined as the area in a plane on the concave side of the curved honeycomb article where a substantial fraction (e.g. greater than about 50%) of the virtual channel extensions converge in a relatively small (e.g., the smallest) area. In FIG. 6, curved honeycomb article 100 has a convergence area 112. Desirably, the convergence area is substantially smaller than the occluded area of the honeycomb structure of the curved honeycomb article. For example, the convergence area may have at least one dimension that is less than 50% of the corresponding dimension of the occluded area of the honeycomb structure. More desirably, the convergence area has at least one dimension that is less than 20% of the corresponding dimension of the occluded area of the honeycomb structure. In certain embodiments of the invention, the convergence area has at least one dimension that is less than 5%, or even less than 1% of the occluded area of the honeycomb structure. The convergence area may have at least two mutually perpendicular dimensions that are each less than 50% of the corresponding dimensions of the occluded area of the honeycomb structure. More desirably, the convergence area has at least two mutually perpendicular dimensions that are each less than 20% of the corresponding dimensions of the occluded area of the honeycomb structure. In certain embodiments of the invention, the convergence area has at least two mutually perpendicular dimensions that are each less than 5%, or even less than 1% of the occluded area of the honeycomb structure. The convergence area desirably has at least one dimension that is less than about 2 cm in length. More desirably, the convergence area desirably has at least one dimension that is less than about 5 mm in length. In certain embodiments of the invention, the convergence area has at least one dimension that is less than about 1 mm in length. In order to be useful in EUV apparati of reasonable size, it is desirable for the convergence area to be less than about 60 cm from a surface on the concave side of the curved honeycomb article. More desirably, the convergence area is within about 30 cm from a surface on the concave side of the curved honeycomb article.

In one envisioned use of the curved honeycomb article, a source of EUV radiation is positioned at or near the convergence area in an atmosphere of an inert buffer gas such as krypton. Any radiation that is given off by the source along one of the virtual channel extensions will propagate unimpeded through the honeycomb structure of the curved honeycomb article. Any soot given off by the source will randomly diffuse in the buffer gas, and will be trapped by the walls of the honeycomb structure. In order to increase the efficiency of the trapping of soot, the honeycomb structure desirably has a channel density of at least about 1.5 channels per square centimeter. More desirably, the honeycomb structure has a channel density of at least about 6 channels per square centimeter. In certain especially desirable embodiments of the invention, the honeycomb structure has a channel density of at least about 13 channels per square centimeter. In order to maintain adequate transparency, the honeycomb structure desirably has a geometrical transparency (total area of channels/area of honeycomb structure) of at least about 50% as viewed from the convergence area. More desirably, the honeycomb structure desirably has a geometrical transparency of at least about 70% as viewed from the convergence area. In certain desirable embodiments of the invention, the honeycomb structure has a geometrical transparency of at least about 90%.

The curved honeycomb articles of the present invention may be constructed to work with a variety of EUV sources. For example, the convergence area may be very small (e.g. 5 mm in dimension, or even 2 mm in dimension), and, for example, roughly square or circular in shape. Alternatively in order to match an elongated shaped source, the convergence area may have an elongated shape, with one dimension substantially larger than the other. For example, to match an elongated shaped source, the curved honeycomb article may be formed as a cylindrical shell segment, with a convergence area as long as the device along the cylindrical axis, and a few millimeters in width. A single curved honeycomb article may have a plurality of honeycomb structures, each having its own convergence area. The skilled artisan will form the curved honeycomb articles having convergence areas to match a desired EUV source.

The curved honeycomb article may have a variety of overall curvatures. For example, the curved honeycomb article may be formed as an essentially spherical shell segment, an essentially oblate shell segment, or as an essentially cylindrical shell segment. In cases where the curved honeycomb article is formed as an essentially spherical shell segment or as an essentially cylindrical shell segment, the curved honeycomb article desirably subtends an angle of at least about 50 degrees in at least one dimension. More desirably, the curved honeycomb article desirably subtends an angle of at least about 70 degrees in at least one dimension. In certain desirable embodiments of the invention, the curved honeycomb article subtends an angle of at least about 85 degrees in at least one dimension. The curved honeycomb article desirably has a concave radius of curvature of less than about 38 cm. More desirably, the curved honeycomb article has a concave radius of curvature of less than about 25 cm. Alternatively, the curved honeycomb article may have a substantially aspherical curvature, such as a parabolic or elliptical curvature. The curved honeycomb article may have a plurality of curved areas, each with an individual honeycomb structure and associated convergence area.

The curved honeycomb article desirably has a thickness of at least about 3 times the minimum cross-sectional dimension of the channels of the honeycomb structure. For example, depending on the channel density of the honeycomb structure, the curved honeycomb article may desirably have a thickness of at least about 3 mm. In alternative embodiments of the invention, the curved honeycomb article may desirably have a thickness of at least about 8 mm. In certain embodiments of the invention, the curved honeycomb article has a thickness of at least about 16 mm.

Figure 8:
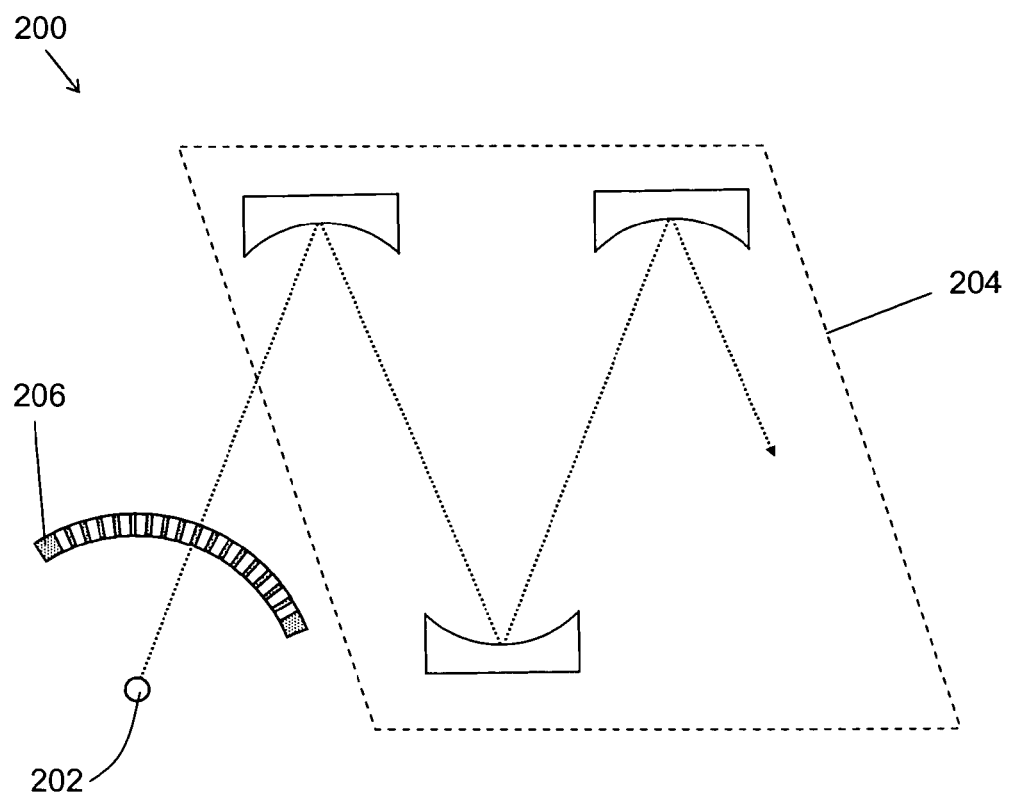
FIG. 8 is a schematic diagram of an EUV lithography apparatus according to one embodiment of the invention.

Another embodiment of the invention relates to an EUV apparatus including a curved honeycomb body. As shown in schematic cross-sectional view in FIG. 8, an EUV apparatus 200 according to this embodiment of the invention includes an EUV source 202, an optical system 204 coupled to the EUV source, and a curved honeycomb article 206 substantially as described hereinabove. Curved honeycomb article 206 is operatively positioned between the source and the optical system, such that a substantial fraction of the EUV radiation generated by the EUV source propagates through the channels of the curved honeycomb article. The curved honeycomb element may have the form of any of the embodiments and variations described hereinabove.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

What is claimed is:

1. An EUV lithography apparatus comprising:
   an EUV source;
   an optical system coupled to the EUV source; and
   a curved honeycomb article made using the process described below placed operatively between the EUV source and the optical system, such that a substantial fraction of the EUV radiation generated by the EUV source propagates through the channels of the curved honeycomb article;

said process comprising the steps of:

providing a honeycomb body having a first face, a second face, and a honeycomb structure having a plurality of substantially parallel channels formed from the first face to the second face;

filling the channels of the honeycomb body with a filler material, thereby forming a filled honeycomb composite;

molding the filled honeycomb composite to form a curved filled honeycomb composite; and finishing the curved filled honeycomb composite into the curved honeycomb article, wherein during the step of molding, the filler material has a plastic deformation behavior compatible with that of the honeycomb body.

2. A curved honeycomb article having a first face, a second face, and a plurality of channels formed from the first face to the second face, each channel having a channel axis;

said curved honeycomb article defining and occluded area when projected upon a plane perpendicular to its channel axis at the geometrical center;

wherein the curved honeycomb article has a width of at least about 15 cm in at least one direction in the plane normal to a channel axis at its geometrical center, and each channel has a virtual channel extension associated therewith, the virtual channel extensions defining a convergence area substantially smaller than the occluded area of the curved honeycomb article; and wherein one of said faces is a concave face and one of said faces is a convex face, and said convergence area is formed in a plane on the concave side of said honeycomb article, and wherein the convergence area has at least one dimension less than about 2 cm in length.

3. The curved honeycomb article of claim 2, wherein the convergence area has at least two mutually perpendicular dimensions less than 5 mm in length.

4. The curved honeycomb article of claim 2, wherein the curved honeycomb article has a thickness of at least about 3 mm.

5. The curved honeycomb article of claim 2, wherein the convergence area is within about 60 cm of a surface on the concave side of the curved honeycomb article.

6. The curved honeycomb article of claim 2, wherein the honeycomb structure has a channel density of at least about 1.5 channels per square cm.

7. The curved honeycomb article of claim 2, wherein the honeycomb structure has a geometrical transparency of at least about 50% as viewed radially from the convergence area.

8. An EUV apparatus comprising:

an EUV source;

an optical system coupled to the EUV source; and the curved honeycomb article of claim 2; wherein the curved honeycomb article is operatively positioned between the source and the optical system, such that a substantial fraction of the EUV radiation generated by the EUV source propagates through the channels of the curved honeycomb article.

9. The curved honeycomb article of claim 2, wherein the curved honeycomb article is formed as an essentially spherical shell segment or an essentially cylindrical shell segment.

10. The curved honeycomb article of claim 9, wherein curved honeycomb article subtends an angle of at least about 70 degrees in at least one direction.

11. The curved honeycomb article of claim 9, wherein the curved honeycomb article has a radius of curvature of less than about 38 cm.

* * * * *